United States Patent [19]

Sugita et al.

[11] Patent Number: 4,913,928
[45] Date of Patent: Apr. 3, 1990

[54] MICROWAVE PLASMA CHEMICAL VAPOR DEPOSITION APPARATUS WITH MAGNET ON WAVEGUIDE

[75] Inventors: Satoshi Sugita, Yokohama; Shotaro Okabe, Kawasaki, both of Japan

[73] Assignee: Canon Kabushiki Kaisha, Tokyo, Japan

[21] Appl. No.: 208,214

[22] Filed: Jun. 17, 1988

[30] Foreign Application Priority Data

Jun. 22, 1987 [JP] Japan ................................ 62-153504

[51] Int. Cl.⁴ .............................................. C23C 16/50
[52] U.S. Cl. ........................................ 427/39; 118/723
[58] Field of Search ......................... 118/723; 427/39

[56] References Cited

U.S. PATENT DOCUMENTS

| | | | |
|---|---|---|---|
| 4,401,054 | 8/1983 | Matsuo | 427/47 |
| 4,481,229 | 11/1984 | Suzuki | 427/47 |
| 4,532,199 | 7/1985 | Ueno | 427/45.1 |

OTHER PUBLICATIONS

Ono, Jap. Journal of App. Phys., vol. 23, No. 8, Aug. 1984, pp. L534–L536.

*Primary Examiner*—Richard Bueker
*Attorney, Agent, or Firm*—Fitzpatrick, Cella, Harper & Scinto

[57] ABSTRACT

In the microwave plasma CVD apparatus according to the present invention, magnets are disposed at the outer circumference of the microwave introduction section thereby forming the magnetic field in the same direction as the direction of introducing the microwave to thereby prevent film deposition to the microwave introduction window. By the apparatus according to the present invention: (1) Microwave can be supplied to the inside of the vacuum chamber always under stabilized state, and (2) the maintenance frequency for the microwave introduction window of the microwave CVD apparatus can be increased.

3 Claims, 6 Drawing Sheets

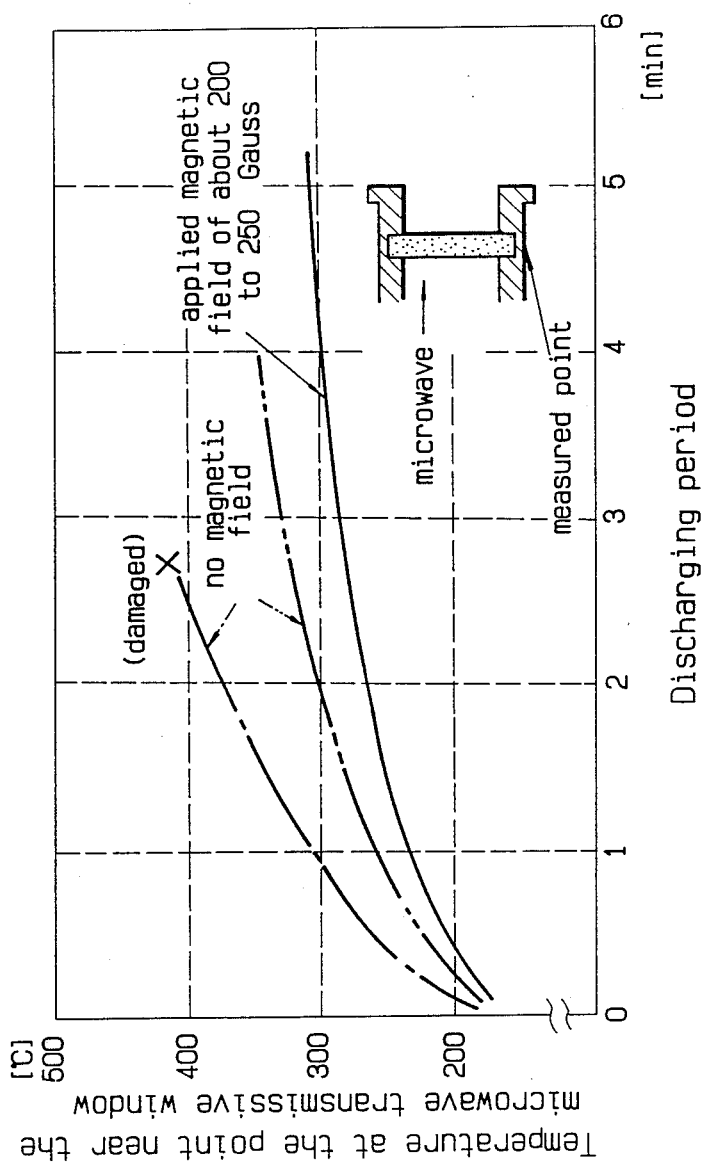

MICROWAVE PLASMA CHEMICAL VAPOR DEPOSITION APPARATUS WITH MAGNET ON WAVEGUIDE

FIELD OF THE INVENTION

The present invention concerns a microwave plasma chemical vapor deposition apparatus (hereinafter referred to as "microwave plasma CVD apparatus") for forming a deposition film on a substrate, particularly, a functional thin films, specifically, for use with semiconductor device, photosensitive device for electrophotography, line sensor for image input, image pick-up device, photovoltaic device, etc.

BACKGROUND OF THE INVENTION

As materials used for devices such as semiconductor device, photosensitive device for electrophotography, line sensor for image input, image pick-up device, photovoltaic device and other various electronic and optical devices, etc., deposition films of amorphous semiconductor such as amorphous silicon compensated, for example, with hydrogen atoms or halogen atoms (for example, fluorine, chlorine) (hereinafter referred to as "A-Si(H, X)") have been proposed and several of then have been put to practical use.

It has been known that such deposition films are formed by a plasma CVD method, that is, a method of decomposing starting material gas with DC current, high frequency wave, microwave or glow discharging and then forming a thin-film deposition layer on a substrate such as made of glass, quartz, heat resistant synthetic resin film, stainless steel or aluminum, as well as various devices therefor have been proposed.

Plasma CVD method of using glow discharging decomposition by microwave has particularly been noted industrially in recent years, and several kind of apparatus for practicing such microwave plasma CVD method have been proposed. They can be generally classified into the following types:

(1) A so-called ECR type plasma CVD apparatus in which plasmas are formed by electron cyclotron resonance (ECR) in a plasma generation chamber and the plasmas are introduced into a film-forming chamber.

(2) A so-called direct introduction type microwave plasma CVD apparatus in which the microwave electric discharge power is directly introduced into a film-forming chamber thereby causing glow discharge plasmas.

FIG. 3 shows a direct introduction type microwave plasma CVD apparatus of the latter type developed by the present inventors. FIG. 3 is a schematic cross sectional view illustrating a typical embodiment of the aforementioned direct introduction type microwave plasma CVD apparatus.

In FIG. 3, there are shown a microwave introduction section 301, a vacuum chamber 302, a substrate (cylindrical) 303 (in a case where the substrate is a plate-like shape, deposition films are formed while bringing the plate-like substrates in close contact with the surface, for example, of an aluminum cylinder), a heater 304 for heating the substrate, an evacuating buffer plate 305, a vacuum seal mechanism 306, a cooling system introduction section 307, a motor 308 for rotating the substrate, a rotational shaft 309 for the substrate, substrate holders 310, 311, plasmas 312, a microwave introduction window 313 and a discharge space A respectively.

The apparatus shown in FIG. 3 has a pseudo circular cavity resonator structure in which a plurality of substrate 303, 303, --- are disposed in a circular arrangement within a vacuum chamber 302 to prepare a cylindrical space (discharge space A) at the central portion of the vacuum chamber and microwave power is charged from the cylindrical end face along at least one direction, thereby causing electric discharge. The microwave introduction section 301 can be designed relatively simply with no requirement for disposing large size solenoid coils or ECR cavity, etc. as in the case of the ECR (electron cyclotron resonance) type plasma CVD apparatus described above. In addition, by using the vacuum chamber 302 or the inner structure thereof as a cavity oscillator, it can supply a greater electric power than the ECR type plasma CVD apparatus and accordingly, it has a merit that the film-forming velocity is relatively high, the gas decomposing efficiency is about 100% and it is suitable to the mass production of the deposition films formed to the substrate of a great area.

FIG. 4 is a schematic cross sectional view schematically, showing in an enlarged scale, the introduction section of the microwave power in the apparatus shown in FIG. 3. In FIG. 4, the are shown a microwave introduction window 401 made of such material as capable of efficiently transmitting microwave power to the inside of the vacuum chamber and maintaining vacuum tightness, for example, formed with quartz glass, alumina ceramics, etc., a vacuum chamber wall 402, a vacuum seal 403 and a microwave guide tube 404. The waveguide tube guide 404 is connected by way of a matching device (not illustrated) and an isolator (not illustrated) to a microwave power source (not illustrated).

The deposition films are formed by using the apparatus as described below.

At first, a plurality of substrates 303, 303, --- are disposed within the vacuum chamber 302, the substrate 303 is rotated by the motor 308 for rotating the substrate and a diffusion pump (not illustrated) is actuated to reduce the pressure within the vacuum chamber to less than $10^{-6}$ Torr. Subsequently, the temperature of the substrate is controlled to a predetermined temperature from 50° C. to 400° C. by using the heater 304 for heating the substrate. When the substrate 303 is heated to a predetermined temperature, predetermined starting material gas, for example, silane gas (SiH$_4$), hydrogen gas (H$_2$), etc. in the case of forming A-Si(H, X) films into the discharge space A from the gas cylinder (not illustrated) to adjust the inner pressure in the discharge space A to a predetermined pressure of lower than $10^m$ Torr. After the inner pressure has been stabilized, microwaves at a frequency of higher than 500 MHz, preferably, 2.45 GHz is generated by a microwave power source (not illustrated) to introduce the microwave energy by way of the microwave introduction section 301 to the discharge space A.

Starting material gas in the vacuum chamber is decomposed by the energy of the microwave and film deposition is caused on the substrate 303 to form a deposition film.

When the present inventors formed an A-Si(H, X) film by the apparatus shown in FIGS. 3 and 4 and using monosilane gas (SiH$_4$) as the starting material gas, the gas decomposing efficiency was about 100% and the deposition velocity was about 100 Å/sec. The amount of the microwave power supplied in this case was 1 KW at the maximum in total. As apparent from the result, according to the microwave plasma CVD apparatus, a much greater deposition velocity can be obtained, which is about 10 times as high as the velocity in the case of using the conventional plasma CVD apparatus using high frequency wave power at a frequency of 13.56 MHz.

However, in the construction of the apparatus shown in FIGS. 3 and 4, the film is also deposited to the microwave introduction section 301, particularly, on the microwave introduction window 401 for supplying the microwave from the atmosphere to the vacuum chamber to worsen the propagation efficiency of the microwave to the inside of the vacuum chamber. Accordingly, it is difficult to supply the microwave into the vacuum chamber always at a stabilized state and, as a result, there is a problem that the control is difficult for the condition of the charged microwave power for efficiently forming the deposition film stationarily at high quality. Furthermore, if the thickness of the deposition film exceeds about 2 um, since the microwave transmission becomes remarkably difficult, it is required to replace the microwave introduction window 401 after successive formation of film, that is, several to 10 and several times. Although the microwave introduction window 401 is made exchangeable at present, there are problems that the time required for exchange upon attachment and detachment is inneglibible, a great number of spare parts have to be arranged for exchange and, further, it needs additional step and cost for the cleaning works of removing films deposited to the detached window.

SUMMARY OF THE INVENTION

The object of the present invention is to provide an improved direct introduction type microwave plasma CVD apparatus free from the problems described above.

Another object of the present invention is to provide an apparatus capable of preventing the deposition of film to the microwave introduction window in a direct introduction type microwave plasma apparatus and capable of reducing the maintenance frequency.

A further object of the present invention is to provide an improved direct introduction type microwave plasma CVD apparatus capable of preventing the deposition of films to a microwave introduction window in the case of forming the deposition film as material used for devices such as semiconductor device, photosensitive device for electrophotography, photovoltaic device and other various electronic and optical device, as well as capable of efficiently forming a high quality and uniform deposition film stationarily.

In the microwave plasma CVD apparatus provided according to the present invention, magnets are disposed at the outer circumferential of the microwave introduction section so as to form a magnetic field in the same direction as that introducing the microwave.

The apparatus according to the present invention has remarkable merits such that the deposition of the film to the microwave introduction window can be prevented, as well as the microwave can be supplied to the inside of the vacuum chamber always in a stabilized state, and the maintenance frequency for the microwave introduction window in the microwave CVD apparatus can be reduced.

BRIEF DESCRIPTION OF THE DRAWINGS

FIG. 6 is a chart illustrating the temperature near the microwave introduction window in the case of using the apparatus shown in FIG. 1.

DESCRIPTION OF THE INVENTION

Figure 1:
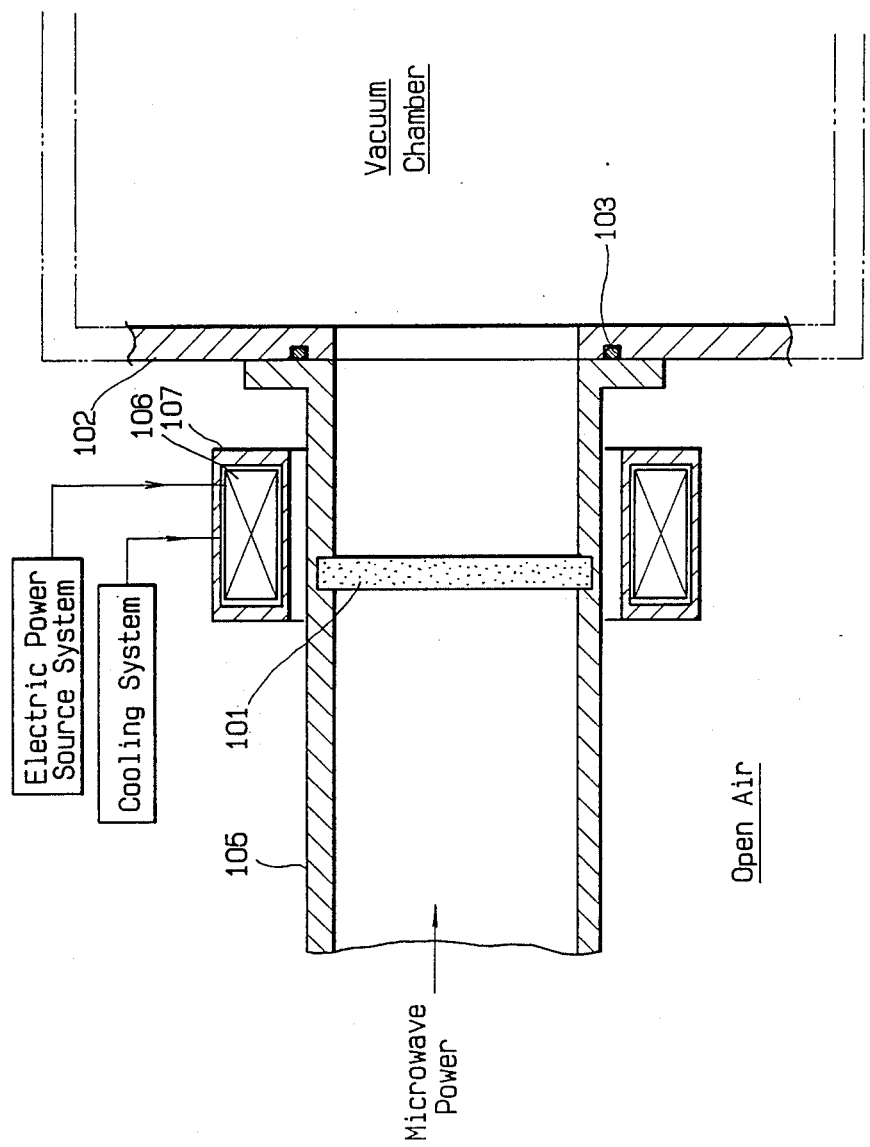
FIG. 1 is an enlarged cross sectional view illustrating one typical embodiment of the microwave introduction section of the microwave CVD apparatus according to the present invention.

The present inventors have made an earnest study for overcoming the foregoing problems in the conventional microwave plasma CVD apparatus of the type adapted to directly introduce microwave to the inside of the vacuum chamber and for attaining the objects as described above and have found that film deposition to the microwave introduction window can be prevented by disposing magnets or electromagnets to the outer circumference near the microwave introduction window in the microwave introduction section such that magnetic field can be formed in the same direction as the introduction direction of the microwave.

The present invention has been achieved based on the finding as described above and the microwave plasma CVD apparatus according to the present invention comprises a vacuum chamber, means for maintaining substrates for forming deposition films in the vacuum chamber, means for supplying starting material gas to the inside of the vacuum chamber, means for evacuating the inside of the vacuum chamber and a microwave introduction section for introducing microwave power to the inside of the vacuum chamber, in which magnets are disposed at the outer circumference of the microwave introducing section.

In the plasma CVD apparatus according to the present invention, the number and the position for the microwave introduction section have no particular restriction and various modifications are possible.

The magnets in the plasma CVD apparatus according to the present invention may be either magnets of constant magnetic force or electromagnets. Magnetic shields may properly be disposed as required to the magnets for preventing the effect of the magnetic field to the outside of the apparatus. Further, in the case of using the electromagnet, the coil wires may be made of superconductive material.

Furthermore, in the apparatus according to the present invention, it is desirable to form the constituents parts other than the magnets in the microwave introduction section with non-magnetic material.

The starting material gases used upon forming the deposition film by the apparatus according to the present invention may be any of gases so long as they are excited by the energy of the microwave and chemically reactive with each other to form a predetermined deposition film on the surface of the substrate. For instance, in the case of forming an A-Si(H, X) film, it is possible to use, as the starting material gas, those gases such as silanes having silicon atoms being bonded with hydrogen, halogen or hydrocarbons, halogenated silanes or, hydrogen gas as the starting material.

Furthermore, it is possible to dope the p-type impurity element or n-type impurity element through the A-Si(H, X) film and the starting material gas containing such impurity elements as the constituent ingredients may be used alone, or they may be used in admixture with the starting material gas as described previously.

Further, the substrate for forming the deposition film may be electroconductive, semiconductive or electrically insulative and it can include, specifically, metals, ceramics, glass, etc. While the substrate temperature upon film-forming operation has no particular restriction, it is generally within a range from 30° to 450° C. and, preferably, from 50° to 350° C.

Furthermore, upon forming the deposition film, it is desirable to reduce the pressure in the film-forming chamber to less than $5 \times 10^{-6}$ Torr, preferably, less than $1 \times 10^{-6}$ Torr before introducing the starting material gas, and, preferably, $1 \times 10^{-6}$ Torr, and it is desirable to set the pressure to $4 \times 10^{-4}$-$2 \times 10^{-3}$ Torr, preferably, from $8 \times 10^{-4}$ to $1 \times 10^{-3}$ Torr upon introducing starting material gas.

The present invention will further be explained more specifically while referring to the apparatus of specific examples, but the present invention is not restricted only thereto.

APPARATUS EXAMPLE 1

Figure 2:
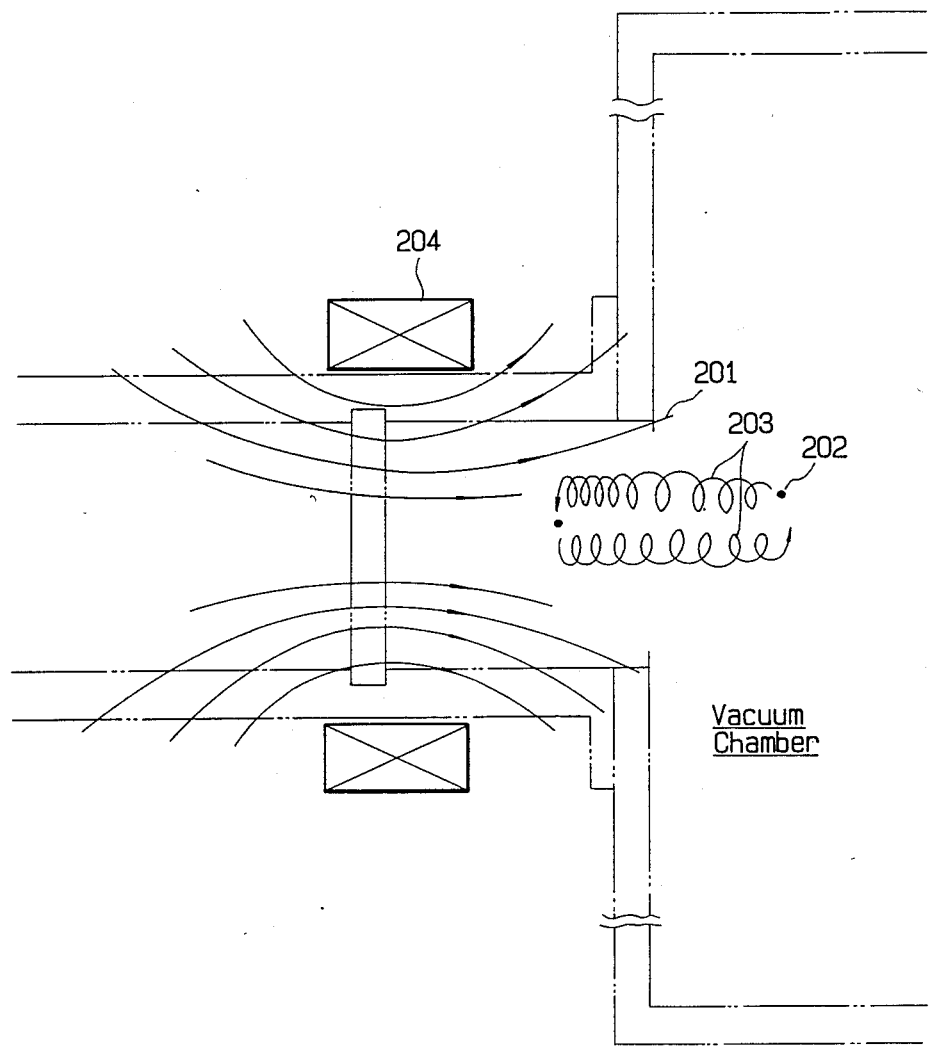
FIG. 2 is a schematic view illustrating the state of the magnetic field generated and the moving trace of electrons in the apparatus shown in FIG. 1.
Figure 3:
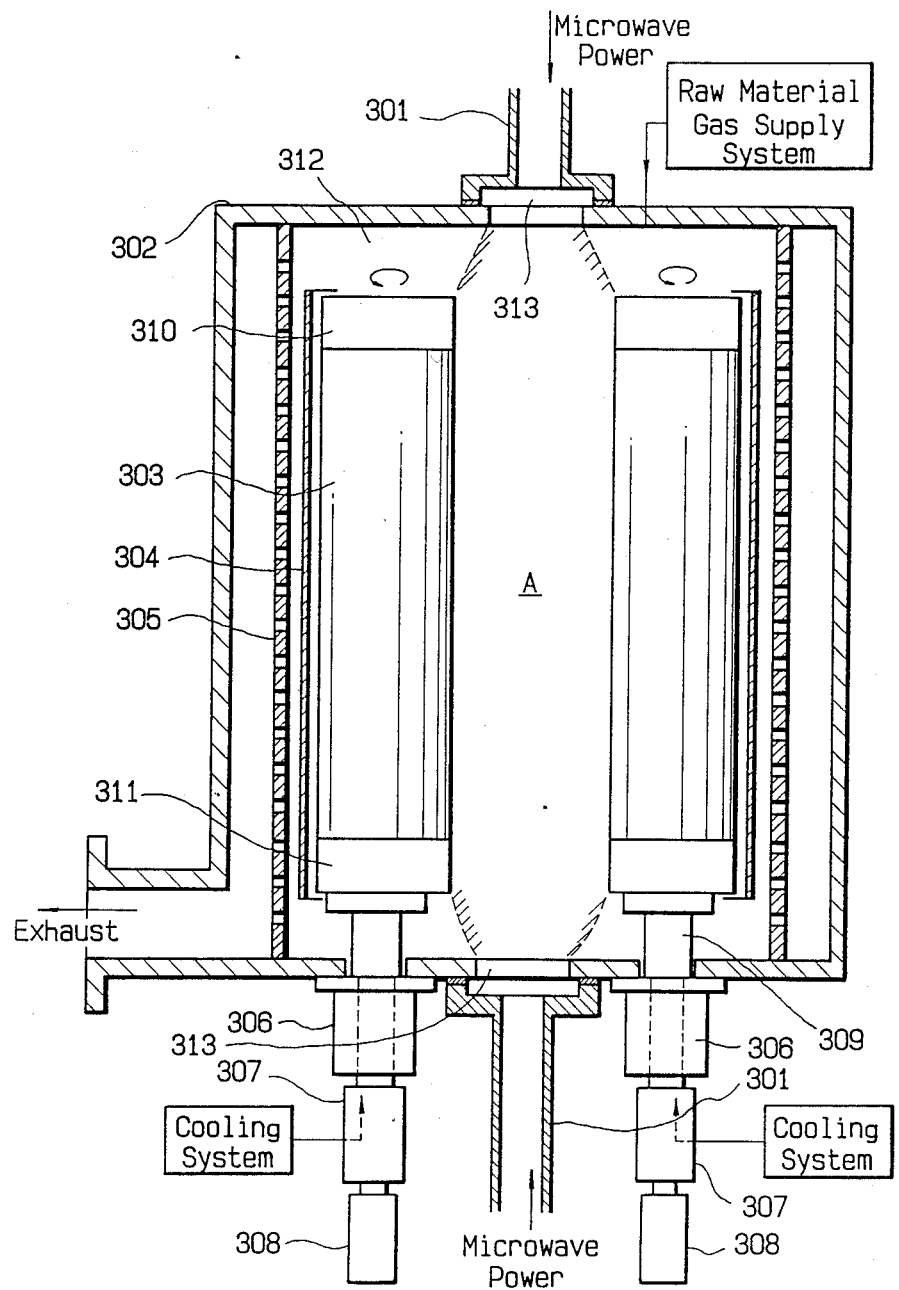
FIG. 3 is schematic cross sectional view illustrating one embodiment of conventional microwave CVD apparatus.
Figure 4:
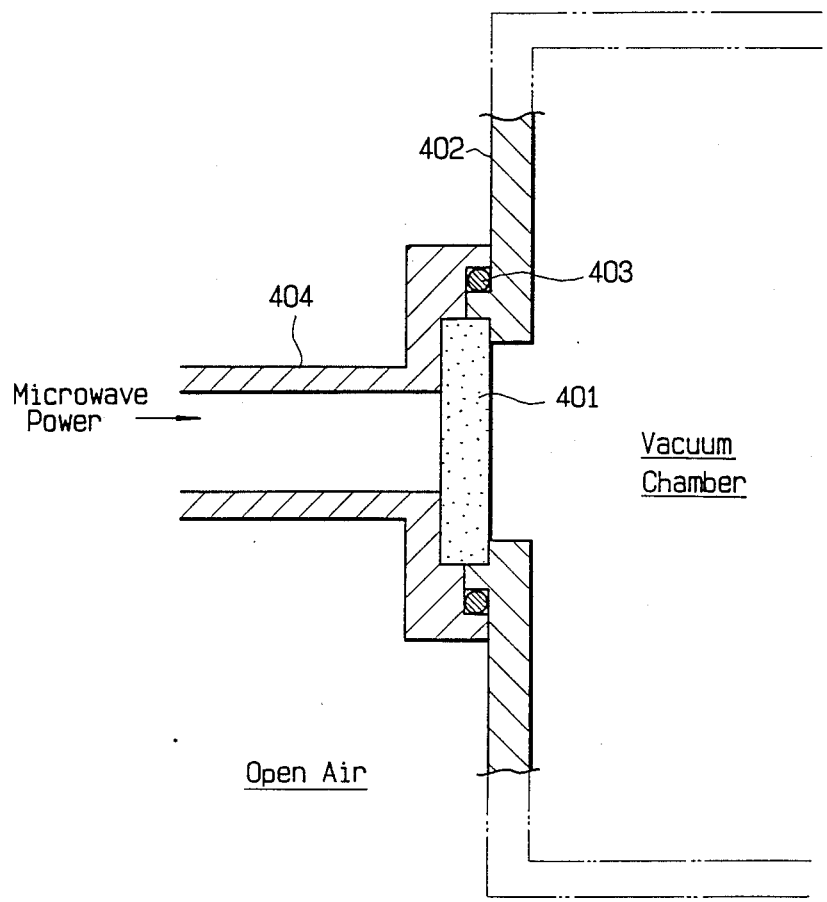
FIG. 4 is an enlarged schematic cross sectional view for a portion for illustrating the microwave introduction portion of the apparatus shown in FIG. 3.

FIG. 1 is an enlarged cross sectional view illustrating a portion of a typical embodiment of the microwave introduction section of a plasma CVD apparatus according to the present invention, and FIG. 2 is a schematic view illustrating the state of forming magnetic fields in the microwave introduction portion of the apparatus according to the present invention.

In FIG. 1, there are shown a microwave introduction window 101, a vacuum chamber wall 102, vacuum seal 103, a microwave introduction window support cylinder 105, an electromagnet coil 106 and a cooling jacket 107 respectively. Further, FIG. 2 shows the magnetic field formed, electrons 202 emitted by gas decomposition, moving traces 203 of electrons 202 near the magnetic field 201 and an electromagnet 204 respectively.

State of supplying the microwave power and the deposition preventing effect in the microwave plasma CVD apparatus according to the present invention are to be explained referring to FIGS. 1 and 2.

Microwave power propagated from a microwave power source by way of a microwave guide tube (both not illustrated) to the introduction portion enters by way of the microwave introduction window 101 to the inside of the vacuum chamber. In this case, the microwave power is properly controlled so as to match the discharging condition within the vacuum chamber thereby forming glow discharge plasmas due to microwave. In this case, electrons emitted upon decomposition of gas molecules in the discharge plasmas draw the moving traces 203 when the magnetic field 201 shown in FIG. 2 is previously formed by the magnet 204 (electromagnet). Since the electrons 202 are accelerated toward the direction in which magnetic field is weak, plasmas do not reach at all to the microwave introducing window 101 or the density of the plasma near the microwave introduction window 101 is extremely low. Accordingly, a state in which less film is deposited to the microwave introducing window 101.

APPARATUS EXAMPLE 2

Figure 5:
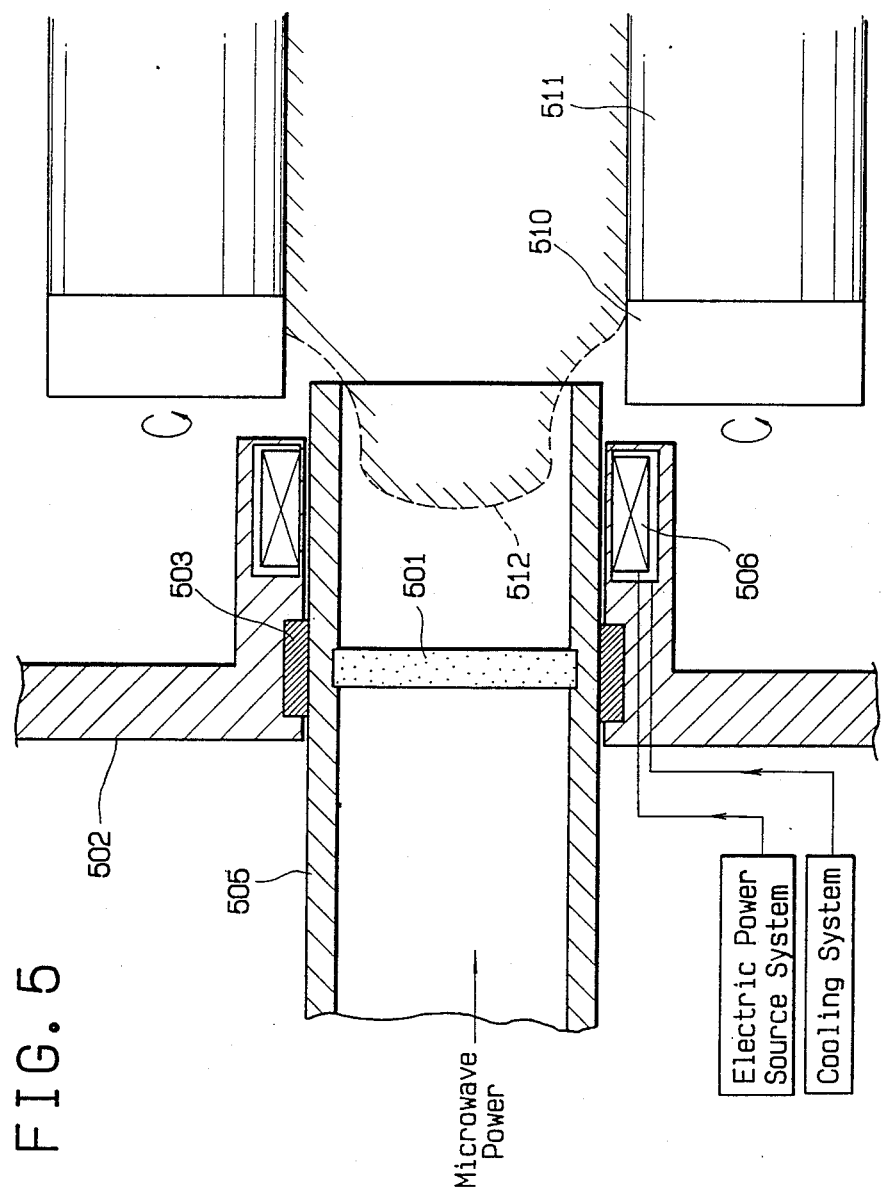
FIG. 5 is an enlarged cross sectional view showing another embodiment of the microwave introduction section in the microwave CVD apparatus according to the present invention.

FIG. 5 is an enlarged cross sectional view for a portion near the microwave introduction section illustrating another embodiment of the plasma CVD apparatus according to the present invention. In the figure, are shown a microwave introduction window 501, a vacuum chamber wall 502, a vacuum seal 503, a microwave introduction window supporting cylinder 505, an electromagnet 506, a substrate holder 510, substrates 511 and microwave plasmas 512 respectively.

The embodiment shows an example in which the microwave introduction window supporting cylinder 505 is made movable in the longitudinal direction. By moving the position of the microwave introduction window, the the microwave discharging condition in the vacuum chamber can optionally be set.

TEST EXAMPLE

In an apparatus shown in FIG. 1 and using SiH$_4$ gas, an A-Si:H film was formed on an Al substrate at the film-forming conditions of film forming inner pressure at $8 \times 10^{-4}$ Torr and microwave charging power of 1.4 kW. Further, A-Si:H film was also formed, as a Comparative Example, under the same conditions except for not applying the magnetic field. The results of measuring the temperature near the microwave introduction window are shown respectively in FIG. 6. As shown in Table-1, although it was necessary to replace the microwave introduction window on every film formation in the case of the test not using the magnetic field, it become apparent that the window had only to be replaced at a frequency of once for 10 and several times by applying the magnetic field.

TABLE-1

|  | No magnetic field applied | Magnetic field applied |
|---|---|---|
| Film forming cycles till window exchange | 1 | 11–20 |
| Deposition velocity | 100 Å/S | 74–112 Å/S |

What is claimed is:

1. A microwave plasma CVD apparatus comprising a vacuum chamber, means for holding substrates in which deposition films are to be formed in said vacuum chamber and capable of maintaining said substrates at a temperature of from 50° to 350° C., means for supplying a film-forming raw material gas comprising a silicon and hydrogen-containing raw material gas to the inside of said vacuum chamber at a desired flow rate, means for evacuating and for maintaining the inside of said vacuum chamber at an inner pressure from $8 \times 10^{-4}$ to $1 \times 10^{-3}$ Torr, and a microwave introduction section for introducing microwave energy to the inside of said vacuum chamber, wherein magnets are disposed at the outer circumference of said microwave introduction section such that as microwave energy passes through said microwave introducing window into said vacuum chamber, said magnets form a magnetic field in the same direction as that of said microwave energy near the microwave introducing window, thereby stabilizing said microwave energy sufficiently to prevent a film from being deposited on said microwave introducing window.

2. A microwave plasma CVD apparatus as defined in claim 1, wherein the constituent materials other than the magnet in the microwave introduction section are made of non-magnetic material.

3. A process for forming a silicon and hydrogen-containing deposited amorphous film on a substrate in a vacuum chamber using a microwave plasma chemical vapor deposition comprising supplying a film-forming raw material gas including a silicon and hydrogen-containing raw material gas into said vacuum chamber at a desired flow rate, maintaining the inner pressure of said vacuum chamber at a value of from $8 \times 10^{-4}$ to $1 \times 10^{-3}$ Torr, maintaining said substrate at a temperature of from 50° to 350° C., and applying a microwave energy through a microwave introducing window into said vacuum chamber to effect formation of said film while actuating magnets positioned adjacent said microwave introducing window so as to form a magnetic field in the same direction as that of said microwave energy near the microwave introducing window, whereby said microwave energy is sufficiently stabilized to prevent a film from being deposited on said microwave introducing window.

* * * * *

UNITED STATES PATENT AND TRADEMARK OFFICE
CERTIFICATE OF CORRECTION

PATENT NO. : 4,913,928
DATED : April 3, 1990
INVENTOR(S) : SATOSHI SUGITA, ET AL It is certified that error appears in the above-identified patent and that said Letters Patent is hereby corrected as shown below:

COLUMN 1

Line 11, "films," should read --film,--.
Line 14, "photovoltatic" should read --photovoltaic--.
Line 21, "photovoltatic" should read --photovoltaic--.
Line 27, "then" should read --them--.
Line 54, "cross sec-" should read --cross-sec- --.

COLUMN 2

Line 5, "strate 303, 303," should read --strates 303, 303,--.
Line 24, "cross sectional" should read --cross-sectional--.
Line 25, "cally, showing" should read --cally showing,--.
Line 27, "the" should read --there--.

COLUMN 3

Line 30, "innegligible" should read --not negligible--.
Line 52, "photovoltatic" should read --photovoltaic--.
Line 58, "circumferential" should read --circumference--.

COLUMN 4

Line 3, "cross sectional" should read --cross-sectional--.
Line 10, "cross sectional" should read --cross-sectional--.
Line 13, "cross sectional" should read --cross-sectional--.

UNITED STATES PATENT AND TRADEMARK OFFICE
CERTIFICATE OF CORRECTION

PATENT NO. : 4,913,928

DATED : April 3, 1990

INVENTOR(S) : SATOSHI SUGITA, ET AL.

It is certified that error appears in the above-identified patent and that said Letters Patent is hereby corrected as shown below:

COLUMN 4

Line 16, "cross sectional" should read --cross-sectional--.
    Line 62, "constituents" should read --constituent--.

COLUMN 6

Line 3, "state in" should read --state is provided in--.
    Line 7, "cross sectional" should read --cross-sectional--.
    Line 20, "the the" should read --the--.
    Line 36, "come" should read --came--.

COLUMN 7

Line 6, "magnet" should read --magnets--.

Signed and Sealed this

Twentieth Day of October, 1992

Attest:

DOUGLAS B. COMER

Attesting Officer     Acting Commissioner of Patents and Trademarks